US012095314B2

(12) United States Patent
Kobayashi et al.

(10) Patent No.: US 12,095,314 B2
(45) Date of Patent: Sep. 17, 2024

(54) DRIVING UNIT

(71) Applicants: HONDA MOTOR CO., LTD., Tokyo (JP); HITACHI ASTEMO, LTD., Ibaraki (JP)

(72) Inventors: Heisuke Kobayashi, Saitama (JP); Tomoyuki Suzuki, Saitama (JP); Takeshi Hoshinoya, Saitama (JP); Fusanori Nishikimi, Ibaraki (JP); Yuki Ishida, Ibaraki (JP)

(73) Assignees: HONDA MOTOR CO., LTD., Tokyo (JP); HITACHI ASTEMO, LTD., Ibaraki (JP)

( * ) Notice: Subject to any disclaimer, the term of this patent is extended or adjusted under 35 U.S.C. 154(b) by 314 days.

(21) Appl. No.: 17/623,770

(22) PCT Filed: Jun. 29, 2020

(86) PCT No.: PCT/JP2020/025541
§ 371 (c)(1),
(2) Date: Dec. 29, 2021

(87) PCT Pub. No.: WO2021/002328
PCT Pub. Date: Jan. 7, 2021

(65) Prior Publication Data
US 2022/0247282 A1 Aug. 4, 2022

(30) Foreign Application Priority Data

Jul. 2, 2019 (JP) .................................. 2019-123958

(51) Int. Cl.
*H02K 11/33* (2016.01)
*H02M 7/00* (2006.01)
(Continued)

(52) U.S. Cl.
CPC ............ *H02K 11/33* (2016.01); *H02M 7/003* (2013.01); *H02P 27/06* (2013.01); *H05K 5/0217* (2013.01); *H02K 5/10* (2013.01)

(58) Field of Classification Search
CPC ......... B60K 6/405; B60K 6/52; B60L 15/007; H02K 11/33; H02K 5/10; H02K 5/225; H02M 7/003; H02P 27/06; H05K 5/0217
See application file for complete search history.

(56) References Cited

U.S. PATENT DOCUMENTS

2005/0168082 A1* 8/2005 Kondo ................. H02K 19/365
310/71
2009/0040724 A1* 2/2009 Nishikimi .......... H05K 7/20927
361/699
(Continued)

FOREIGN PATENT DOCUMENTS

CN 102355143 A 2/2012
JP 2005-033985 A 2/2005
(Continued)

OTHER PUBLICATIONS

WO-2006109714-A1, Fuji et al., all pages (Year: 2006).*
(Continued)

*Primary Examiner* — Naishadh N Desai
(74) *Attorney, Agent, or Firm* — Paratus Law Group, PLLC

(57) ABSTRACT

A driving unit includes a rotary electric machine which has a rotation axis extending in a horizontal direction, a rotary electric machine case, and an electric power conversion device. The electric power conversion device has an electric power conversion device case and is disposed on one side of the rotary electric machine in an orthogonal direction. The electric power conversion device case is fixed to the rotary electric machine case. At either the electric power conversion device case or the rotary electric machine case, a guide (Continued)

portion protruding in the orthogonal direction and extending in the rotation axis direction is formed above a connecting portion where the rotary electric machine and the electric power conversion device are electrically connected.

5 Claims, 9 Drawing Sheets

(51) Int. Cl.
  *H02P 27/06* (2006.01)
  *H05K 5/02* (2006.01)
  *H02K 5/10* (2006.01)

(56) References Cited

U.S. PATENT DOCUMENTS

| | | | |
|---|---|---|---|
| 2009/0079280 A1* | 3/2009 | Terauchi | H02K 29/08 |
| | | | 310/68 B |
| 2012/0039039 A1 | 2/2012 | Nishikimi et al. | |
| 2012/0170217 A1 | 7/2012 | Nishikimi et al. | |
| 2013/0279114 A1* | 10/2013 | Nishikimi | B60L 15/007 |
| | | | 361/699 |
| 2014/0016387 A1 | 1/2014 | Nishikimi et al. | |
| 2015/0055386 A1 | 2/2015 | Nishikimi et al. | |
| 2016/0056681 A1* | 2/2016 | Major | H02K 5/18 |
| | | | 310/64 |
| 2018/0022202 A1 | 1/2018 | Urabe et al. | |
| 2018/0262089 A1 | 9/2018 | Hatch | |
| 2019/0229584 A1 | 7/2019 | Shinozaki et al. | |
| 2020/0280246 A1 | 9/2020 | Deng et al. | |

FOREIGN PATENT DOCUMENTS

| | | | | |
|---|---|---|---|---|
| JP | 2010-105492 A | 5/2010 | | |
| JP | 2015-123890 A | 7/2015 | | |
| JP | 2015-228795 A | 12/2015 | | |
| JP | 6312114 B1 | 4/2018 | | |
| WO | WO-2006109714 A1 * | 10/2006 | | H02K 11/33 |
| WO | WO 2016/121032 A1 | 8/2016 | | |
| WO | WO 2019/051824 A1 | 3/2019 | | |

OTHER PUBLICATIONS

May 16, 2023, European Communication issued for related EP Application No. 20834180.0.
Aug. 12, 2022, European Search Report issued for related EP Application No. 20834180.0.
Sep. 15, 2020, International Search Report issued for related PCT Application No. PCT/JP2020/025541.
Sep. 15, 2020, International Search Opinion issued for related PCT Application No. PCT/JP2020/025541.
Jun. 26, 2023, Translation of Chinese Office Action issued for related CN Application No. 202080048489.3.
Nov. 10, 2023, European Communication issued for EP Application No. 20834180.0.
Jan. 9, 2024, Translation of Japanese Office Action issued for related JP Application No. 2021-530018.

* cited by examiner

DRIVING UNIT

CROSS REFERENCE TO PRIOR APPLICATION

This application is a National Stage Patent Application of PCT International Patent Application No. PCT/JP2020/025541 (filed on Jun. 29, 2020) under 35 U.S.C. § 371, which claims priority to Japanese Patent Application No. 2019-123958 (filed on Jul. 2, 2019), which are all hereby incorporated by reference in their entirety.

TECHNICAL FIELD

The present invention relates to a driving unit equipped with an electric vehicle or the like.

BACKGROUND ART

A vehicle such as hybrid and electric vehicles using a rotary electric machine as a driving source is known. The vehicle is equipped with the rotary electric machine and an electric power conversion device which is electrically connected to the rotary electric machine and converts the electric power supplied to the rotary electric machine and the electric power supplied from the rotary electric machine. In the related art, the rotary electric machine and the electric power conversion device are electrically connected by using a three-phase line. In recent years, however, attempts have been made to turn the rotary electric machine and the electric power conversion device into a unit by direct fixing.

For example, Patent Literature 1 proposes to directly fix an electric power conversion device as a driving unit above a rotary electric machine. However, in the configuration described in Patent Literature 1, an increase in the height dimension of the driving unit leads to a decline in the degree of freedom in terms of layout. Patent Literature 2 proposes to directly fix an electric power conversion device as a driving unit to one side of a rotary electric machine in an orthogonal direction orthogonal to both a rotation axis direction and an up-down direction.

CITATION LIST

Patent Literature

Patent Literature 1: WO-A-2016/121032
Patent Literature 2: US-A-2018/0262089

SUMMARY OF INVENTION

Technical Problem

However, in the driving unit of Patent Literature 2, the electric power conversion device is fixed to one side of the rotary electric machine in the orthogonal direction orthogonal to both the rotation axis direction and the up-down direction. In a case where foreign matter such as water enters from above the driving unit, the foreign matter enters the connecting portion, where the rotary electric machine and the electric power conversion device are electrically connected, from between an electric power conversion device case and a rotary electric machine case. Then, electric leakage or the like may occur.

The present invention provides a driving unit capable of preventing foreign matter from entering the connecting portion where a rotary electric machine and an electric power conversion device are electrically connected even in a case where the foreign matter such as water enters between an electric power conversion device case and a rotary electric machine case from above the driving unit.

Solution to Problem

A driving unit including:
a rotary electric machine which has a rotation axis extending in a horizontal direction;
a rotary electric machine unit which includes a rotary electric machine case having a rotary electric machine accommodating portion accommodating the rotary electric machine; and
an electric power conversion device which is electrically connected to the rotary electric machine and converts electric power supplied to the rotary electric machine and electric power supplied from the rotary electric machine, in which:
the electric power conversion device has an electric power conversion device case and is disposed on one side of the rotary electric machine case in an orthogonal direction orthogonal to both a rotation axis direction and an up-down direction;
the electric power conversion device case is fixed to the rotary electric machine case,
a connecting portion where the rotary electric machine and the electric power conversion device are electrically connected is provided; and
a guide portion protruding in the orthogonal direction and extending in the rotation axis direction is formed above the connecting portion at either the electric power conversion device case or the rotary electric machine case.

Advantageous Effects of Invention

According to the present invention, the guide portion protruding in the orthogonal direction and extending in the rotation axis direction is formed above the connecting portion at either the electric power conversion device case or the rotary electric machine case. As a result, even in a case where foreign matter such as water enters between the electric power conversion device case and the rotary electric machine case from above the driving unit, the foreign matter which enters from above the connecting portion is guided in the rotation axis direction along the guide portion. As a result, it is possible to prevent the foreign matter which enters from above the connecting portion from entering the connecting portion.

DESCRIPTION OF EMBODIMENTS

Figure 1:
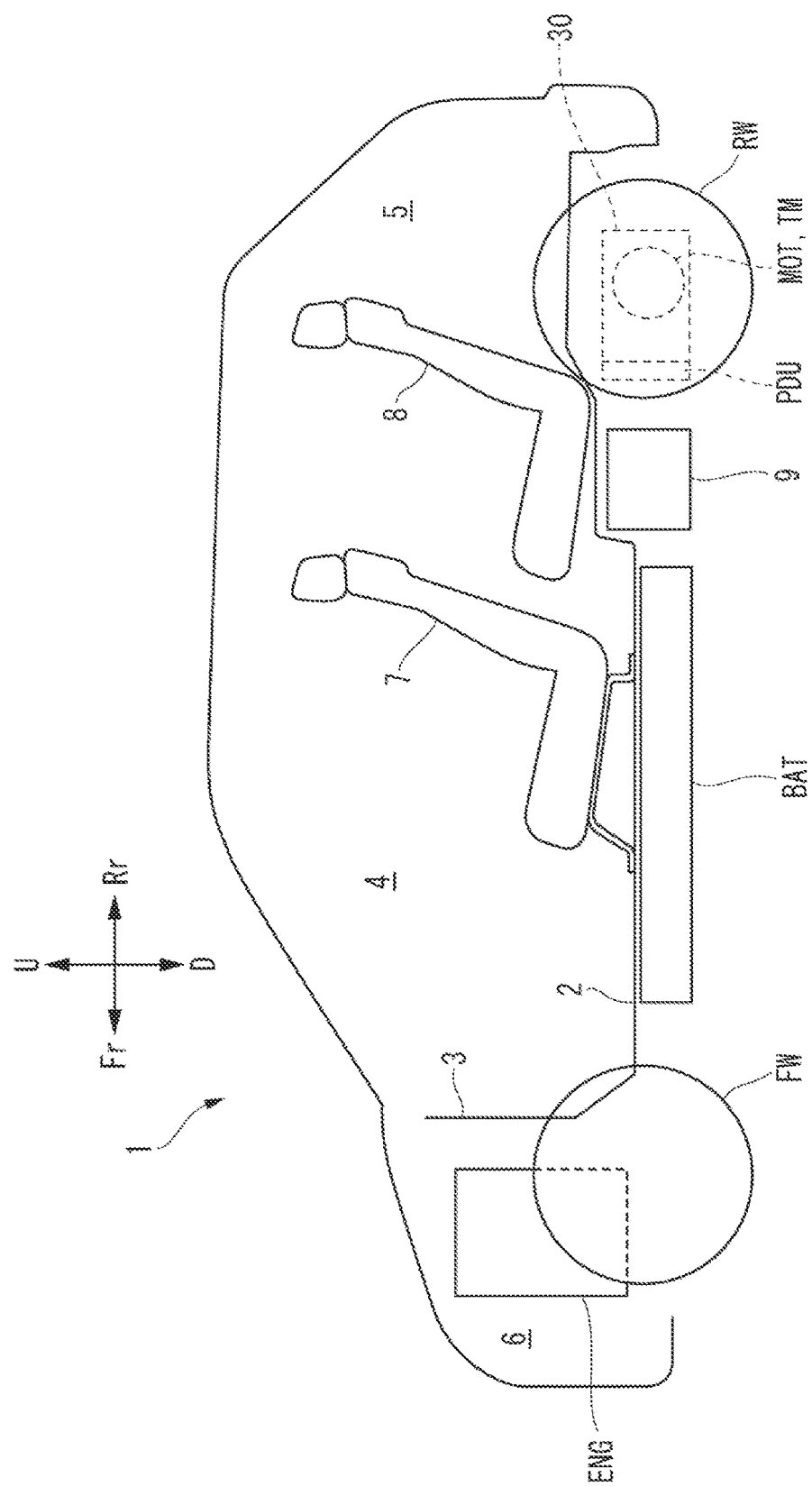
FIG. 1 is a schematic side view illustrating an overall structure of a vehicle capable of being equipped with the driving unit of an embodiment of the present invention.

Hereinafter, a driving unit of one embodiment of the present invention and a vehicle of one embodiment equipped with the driving unit will be described with reference to the drawings. The front-rear, left-right, and up-down directions in the following description are directions seen from a vehicle operator. In the drawings, Fr is the front of the vehicle, Rr is the rear of the vehicle, L is the left side of the vehicle, R is the right side of the vehicle, U is the upper side of the vehicle, and D is the lower side of the vehicle.

[Vehicle]

Figure 2:
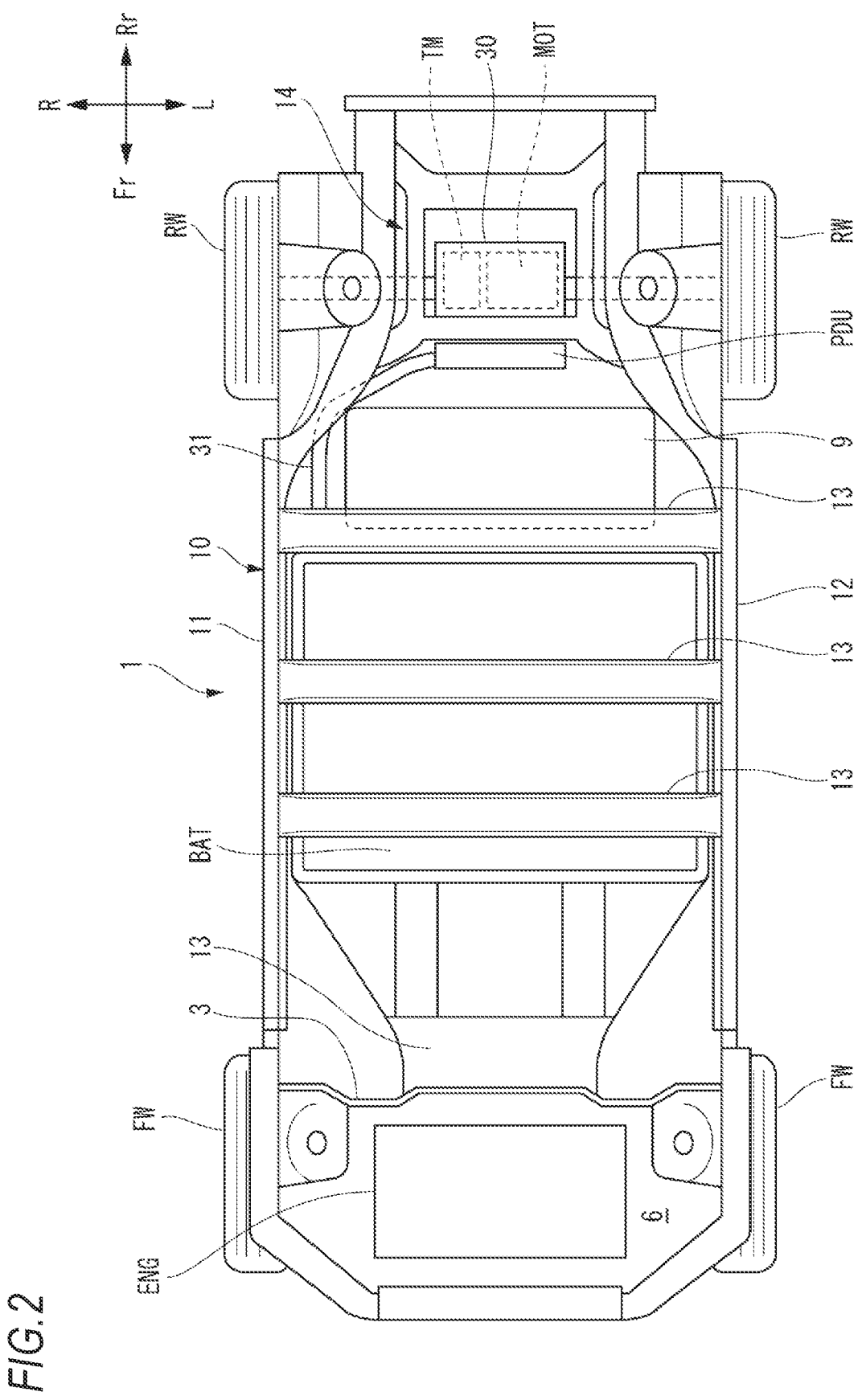
FIG. 2 is a plan view illustrating the underfloor structure of the vehicle of FIG. 1.

As illustrated in FIGS. 1 and 2, a vehicle 1 is divided into passenger compartment 4 and luggage compartment 5 and a front room 6 in front thereof by a floor panel 2 and a dash panel 3. The passenger compartment 4 is provided with a front seat 7 and a rear seat 8. The front room 6 is provided with an engine ENG as a driving source driving left and right front wheels FW. A driving unit 30 which accommodates an electric motor MOT as a driving source driving left and right rear wheels RW is provided below the luggage compartment 5. In other words, the vehicle 1 is a so-called hybrid vehicle using both the engine ENG and the electric motor MOT as driving sources.

A battery BAT and a fuel tank 9 are disposed below the passenger compartment 4. The battery BAT and the driving unit 30 are connected via a DC line 31. The engine ENG and the fuel tank 9 are connected via fuel piping (not illustrated).

A vehicle body frame 10 includes a pair of left and right side frames 11 and 12 extending in the front-rear direction, a plurality of cross members 13 extending in the vehicle width direction (hereinafter, also referred to as the left-right direction) and interconnecting the side frames 11 and 12, and a subframe 14 supporting the driving unit 30 and having a substantially rectangular shape in a plan view.

[Driving Unit]

Figure 3:
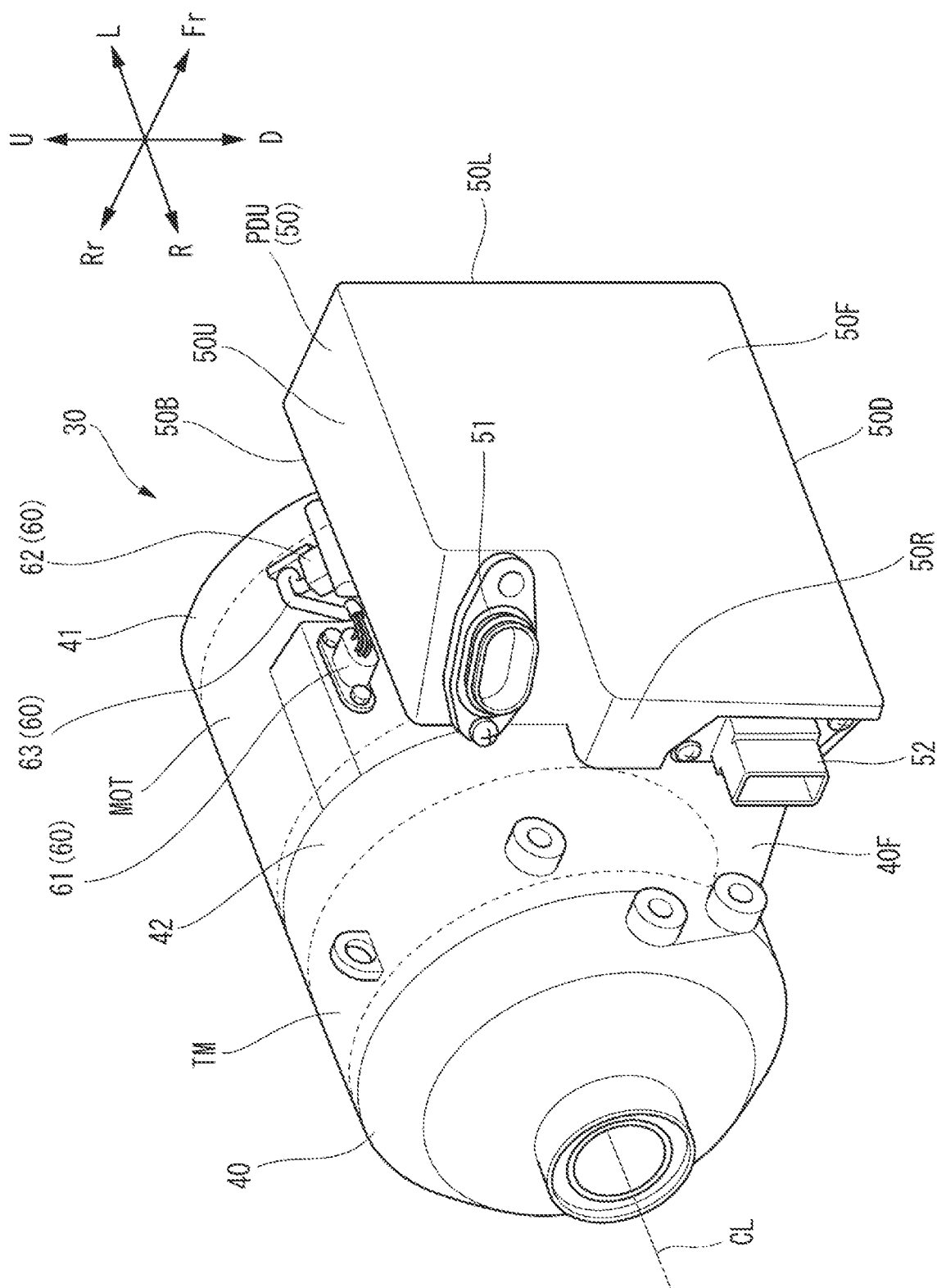
FIG. 3 is an overall perspective view of the driving unit of an embodiment of the present invention.

As illustrated in FIG. 3, the driving unit 30 includes the electric motor MOT, an electric power conversion device PDU which is electrically connected to the electric motor MOT and converts the electric power supplied to the electric motor MOT and the electric power supplied from the electric motor MOT, and a power transmission mechanism TM which transmits the power of the electric motor MOT to the rear wheel RW. The electric power conversion device PDU is, for example, an inverter.

The electric motor MOT has a substantially cylindrical shape, and a rotation axis CL extends substantially horizontally in the vehicle width direction. The rotation axis CL is the axial center of rotation of the electric motor MOT. The power transmission mechanism TM is disposed side by side in the vehicle width direction with the electric motor MOT such that the axial center of an output axis is coaxial with the rotation axis CL of the electric motor MOT. In the present embodiment, the electric motor MOT and the power transmission mechanism TM are disposed side by side such that the electric motor MOT is on the left side and the power transmission mechanism TM is on the right side in the vehicle width direction.

The electric motor MOT and the power transmission mechanism TM are accommodated in an electric motor case 40. The electric motor case 40 has an electric motor accommodating portion 41 and a power transmission mechanism accommodating portion 42. The electric motor MOT is accommodated in the electric motor accommodating portion 41, and the power transmission mechanism TM is accommodated in the power transmission mechanism accommodating portion 42.

The electric power conversion device PDU is disposed adjacent to the front of the electric motor MOT and the power transmission mechanism TM in the front-rear direction of the vehicle 1. The electric power conversion device PDU is positioned between the electric motor MOT and the power transmission mechanism TM and the passenger compartment 4 (see FIG. 1). In other words, in the present embodiment, the electric power conversion device PDU is positioned in front of the electric motor MOT and the power transmission mechanism TM. Accordingly, in the event of a rear collision of the vehicle 1, the impact is input to the electric motor MOT and the power transmission mechanism TM positioned behind the electric power conversion device PDU in the driving unit 30. As a result, it is possible to prevent the impact caused by the rear collision of the vehicle 1 from being directly input to the electric power conversion device PDU.

The electric power conversion device PDU has an electric power conversion device case 50. The electric power conversion device case 50 has a substantially rectangular parallelepiped shape and has a front surface 50F, a rear surface 50B, a left side surface 50L, a right side surface 50R, an upper surface 50U, and a lower surface 50D. The electric power conversion device case 50 is fixed to the electric motor case 40 such that the rear surface 50B of the electric power conversion device case 50 faces a front surface 40F of the electric motor case 40.

A DC connector 51 is provided on the upper side of the right side surface 50R of the electric power conversion device case 50, and a low-voltage connector 52 is provided on the lower side of the right side surface 50R of the electric power conversion device case 50.

The DC line 31 is connected to the DC connector 51 (see FIG. 7), and the electric power conversion device PDU and the battery BAT are electrically connected via the DC line 31.

A low-voltage line 32 is connected to the low-voltage connector 52 (see FIG. 7), and electric power for driving the electric power conversion device PDU is supplied to the electric power conversion device PDU. The low-voltage line 32 may be connected to the battery BAT or a low-voltage battery (not illustrated) provided separately from the battery BAT.

Figure 4:
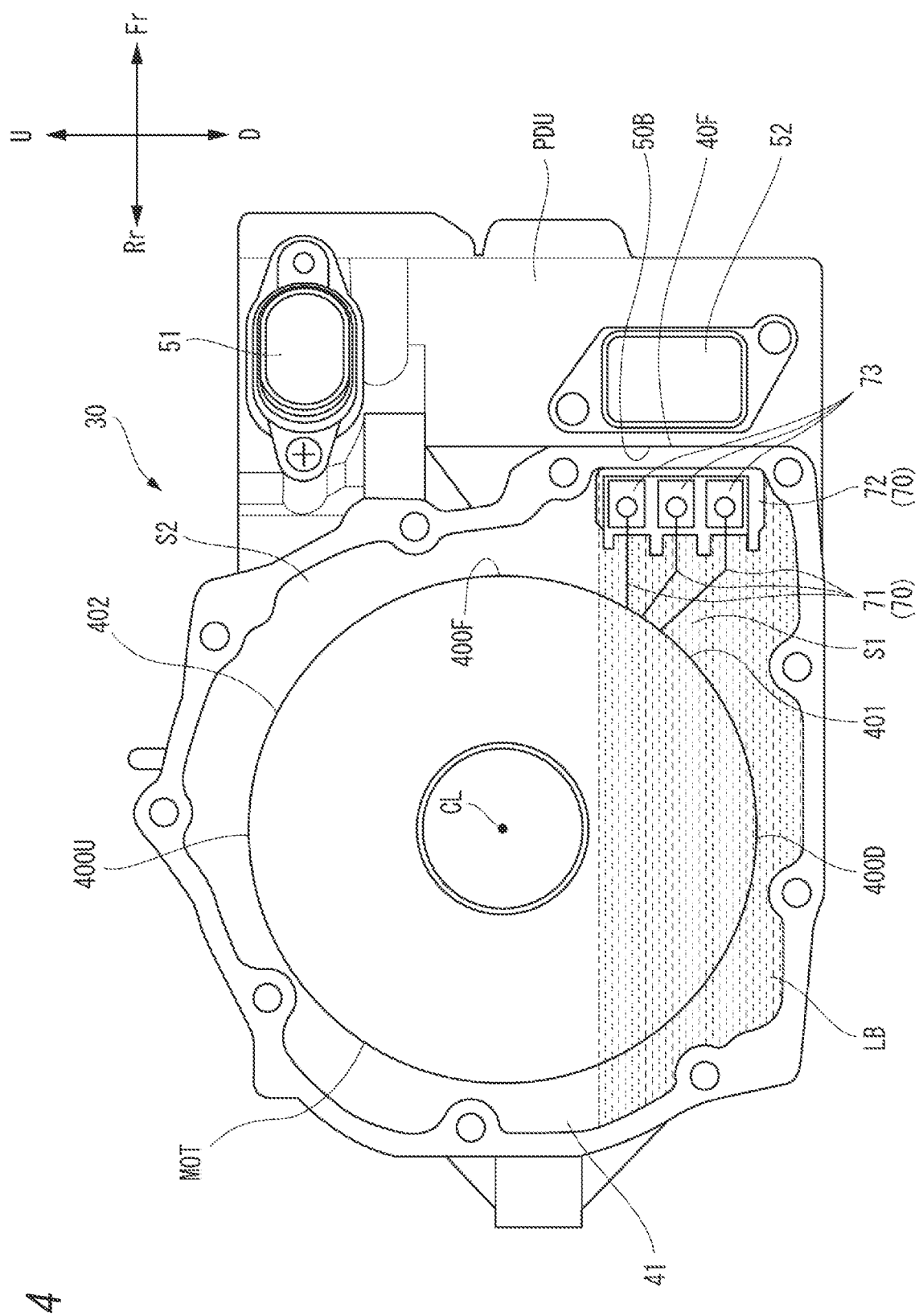
FIG. 4 is a cross-sectional view of a main part in which the electric motor accommodating portion and the electric power conversion device of the driving unit of FIG. 3 are viewed from the right side.
Figure 5:
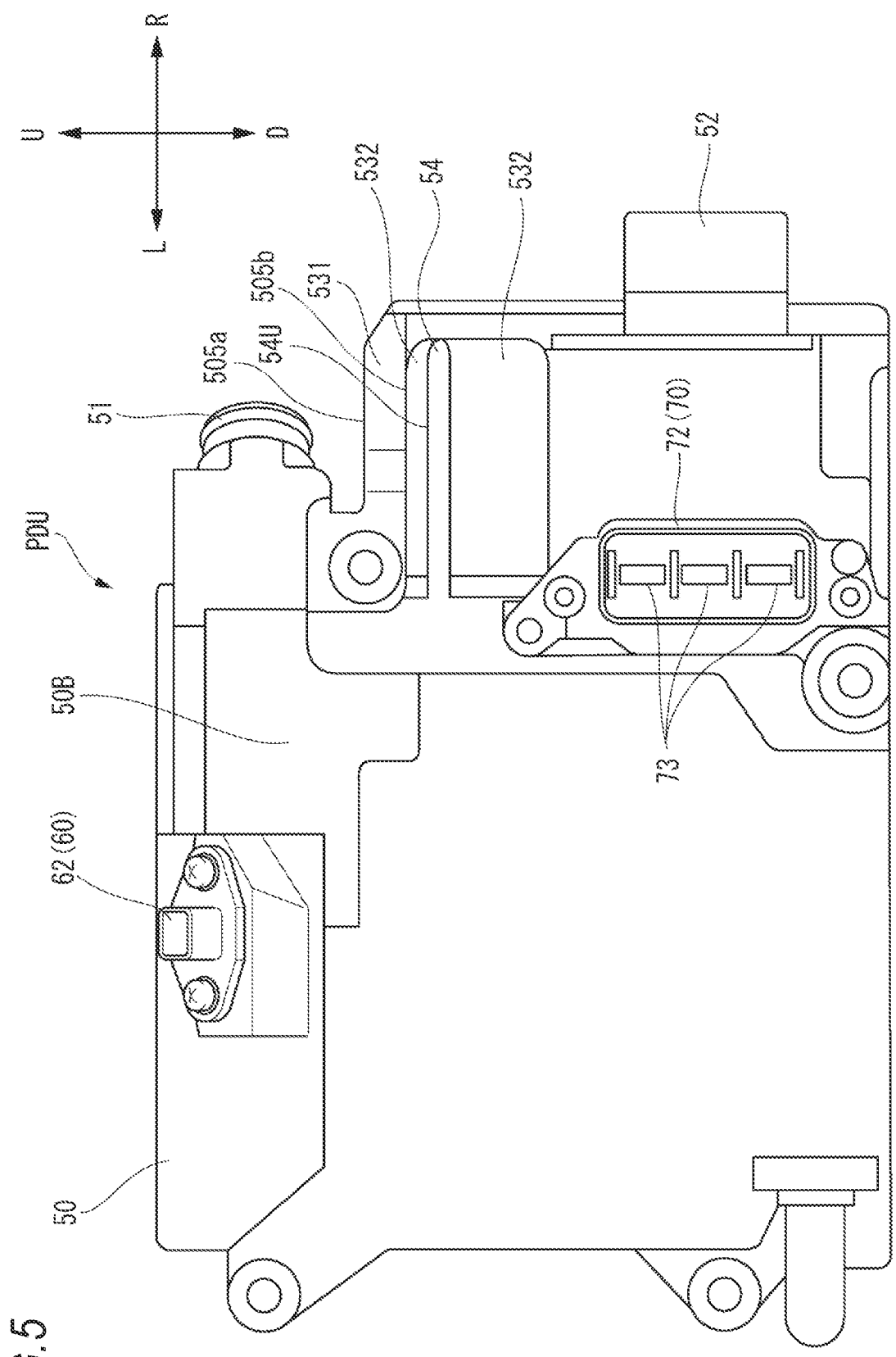
FIG. 5 is a rear view of the electric power conversion device of the driving unit of FIG. 3.

As illustrated in FIGS. 4 and 5, the driving unit 30 includes an electric motor connecting portion 70 which electrically connects the electric motor MOT and the electric power conversion device PDU. Electrically connecting the electric motor MOT and the electric power conversion device PDU means that the electric motor MOT and the electric power conversion device PDU are connected such that electric power is exchangeable therebetween. The electric motor connecting portion 70 has three coil lead wires 71 of U phase, V phase, and W phase extending from the electric motor MOT and an electric power conversion device-side electric power connector 72 protruding from the rear surface 50B of the electric power conversion device case 50 into the electric motor accommodating portion 41 of the electric motor case 40. The electric power conversion device-side electric power connector 72 is provided with terminal portions 73 of three bus bars connected to the substrate of the electric power conversion device PDU, and the three coil lead wires 71 are connected to the terminal portions 73 of the three bus bars.

As a result, the direct current electric power from the battery BAT is converted into alternating current electric power by the electric power conversion device PDU and supplied to the electric motor MOT during the power driving of the electric motor MOT. The alternating current electric power from the electric motor MOT is converted into direct current electric power by the electric power conversion device PDU and supplied to the battery BAT during the regenerative driving of the electric motor MOT.

As illustrated in FIG. 4, the electric motor connecting portion 70 is disposed below the rotation axis CL and between the electric motor MOT and the electric power conversion device PDU in the front-rear direction of the vehicle 1. As a result, the space between the electric motor MOT and the electric power conversion device PDU can be effectively used in the driving unit 30 and the driving unit 30 can be reduced in size. More specifically, the electric motor MOT has a substantially cylindrical shape, the electric power conversion device PDU has a substantially rectangular parallelepiped shape, and thus a space S1 is formed between a lower front-side cylindrical surface 401 extending from a front end portion 400F of the electric motor MOT to a lower end portion 400D and the rear surface 50B of the electric power conversion device case 50 even with the front end portion 400F of the electric motor MOT as close as possible to the electric power conversion device PDU side when viewed from the rotation axis direction. By disposing the electric motor connecting portion 70 in the space S1, the space S1 can be effectively used and the electric motor MOT can be disposed closer to the electric power conversion device PDU side. As a result, the dimension of the driving unit 30 in the front-rear direction can be reduced without increasing the dimension of the driving unit 30 in the up-down direction.

Lubricating oil LB is stored below the electric motor accommodating portion 41 of the electric motor case 40. At least a part of the coil lead wire 71 and the electric power conversion device-side electric power connector 72 of the electric motor connecting portion 70 is immersed in the lubricating oil LB stored below the electric motor accommodating portion 41. As a result, the electric motor connecting portion 70 can be cooled by the lubricating oil LB.

As illustrated in FIG. 5, the electric motor connecting portion 70 is disposed to the right of the middle of the electric power conversion device PDU in the left-right direction.

As illustrated in FIG. 3, the driving unit 30 includes a sensor connecting portion 60 which electrically connects a sensor provided to the electric motor MOT and the electric power conversion device PDU. Electrically connecting the sensor and the electric power conversion device PDU means that the sensor and the electric power conversion device PDU are connected such that a signal from the sensor can be input to the electric power conversion device PDU. The sensor connecting portion 60 has an electric motor-side sensor connector 61 provided to the electric motor case 40, a device-side sensor connector 62 provided to the electric power conversion device case 50, and a signal line 63 electrically connecting the electric motor-side sensor connector 61 and the device-side sensor connector 62. The electric motor-side sensor connector 61 is electrically connected to the sensor (not illustrated) provided to the electric motor MOT. The sensor is not particularly limited insofar as the sensor is capable of detecting the state of the electric motor MOT. The sensor is, for example, a resolver detecting the rotational state of the electric motor MOT or a thermistor detecting the temperature of the electric motor MOT.

The sensor connecting portion 60 is disposed above the rotation axis CL and between the electric motor MOT and the electric power conversion device PDU in the front-rear direction of the vehicle 1. As a result, the space between the electric motor MOT and the electric power conversion device PDU can be effectively used in the driving unit 30 and the driving unit 30 can be reduced in size. More specifically, the electric motor MOT has a substantially cylindrical shape, the electric power conversion device PDU has a substantially rectangular parallelepiped shape, and thus a space S2 is formed between an upper front-side cylindrical surface 402 extending from the front end portion 400F of the electric motor MOT to an upper end portion 400U and the rear surface 50B of the electric power conversion device case 50 even with the front end portion 400F of the electric motor MOT as close as possible to the electric power conversion device PDU side when viewed from the rotation axis direction. By disposing the sensor connecting portion 60 in the space S2, the space S2 can be effectively used and the electric motor MOT can be disposed closer to the electric power conversion device PDU side. As a result, the dimension of the driving unit 30 in the front-rear direction can be reduced without increasing the dimension of the driving unit 30 in the up-down direction.

The sensor connecting portion 60 may be disposed at any position in the left-right direction. In the present embodiment, the electric motor-side sensor connector 61 is disposed near the middle of the electric motor case 40 and the device-side sensor connector 62 is disposed near the middle of the electric power conversion device case 50 in the left-right direction. It is preferable that the electric motor-side sensor connector 61 and the device-side sensor connector 62 are disposed close to each other. As a result, the signal line 63 can be shortened.

Figure 6:
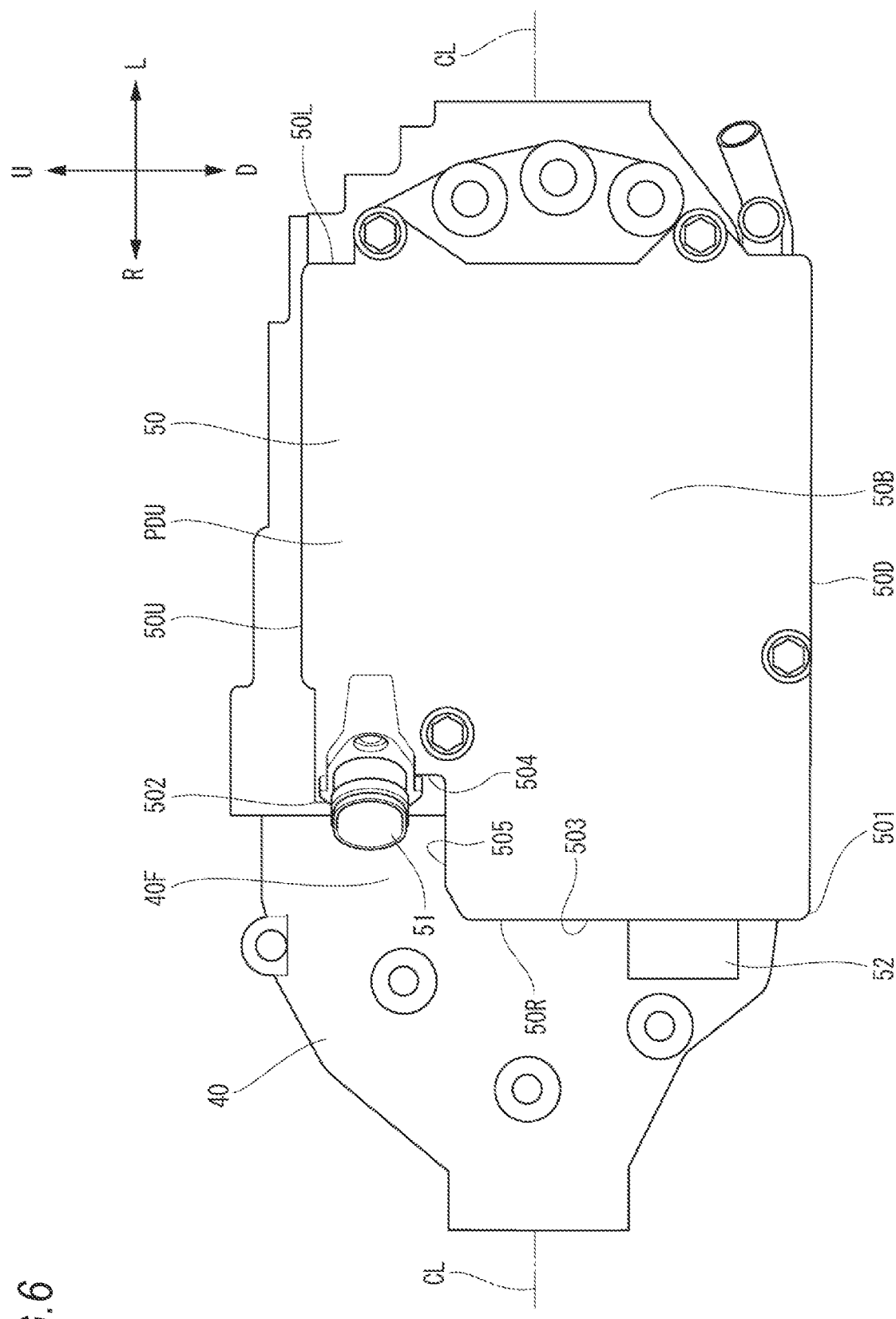
FIG. 6 is a front view of the driving unit of FIG. 3.

As illustrated in FIG. 6, as for the electric power conversion device case 50 of the electric power conversion device PDU which is viewed from the front-rear direction, an upper right end portion 502 is positioned to the left of a lower right end portion 501 in the left-right direction. The right side surface 50R of the electric power conversion device case 50 is provided with a lower right side surface 503 extending upward from the lower right end portion 501 of the electric power conversion device case 50, an upper right side surface 504 extending downward from the upper right end portion 502 of the electric power conversion device case 50 and positioned to the left of the lower right side surface 503 in the left-right direction, and a step surface 505 connecting the upper end portion of the lower right side surface 503 and the lower end portion of the upper right side surface 504 in the left-right direction.

The DC connector 51 is disposed on the upper right side surface 504, and the low-voltage connector 52 is disposed on the lower right side surface 503.

The DC connector 51 is positioned above the rotation axis CL and below the upper surface of the electric power conversion device PDU in the up-down direction and to the left of the lower right side surface 503 in the left-right direction. Since the DC connector 51 is positioned above the rotation axis CL, it is possible to prevent the DC connector 51 from being damaged or causing electric leakage even in a case where foreign matter enters from below the vehicle 1. In addition, since the DC connector 51 is positioned below the upper surface of the electric power conversion device PDU and to the left of the lower right side surface 503 in the left-right direction, it is possible to prevent the DC connector 51 from being exposed outside the electric power conversion device PDU in the up-down direction and the left-right direction (rotation axis direction). Further, since the DC connector 51 is positioned to the left of the lower right side surface 503 in the left-right direction, the lower right side surface 503 can be visually recognized with ease from above the driving unit 30 (see FIG. 7). Since the low-voltage connector 52 is disposed on the lower right side surface 503, which can be visually recognized with ease from above the driving unit 30, excellence in maintainability is achieved while the space of the lower right side surface 503 of the electric power conversion device PDU is effectively used.

Figure 7:
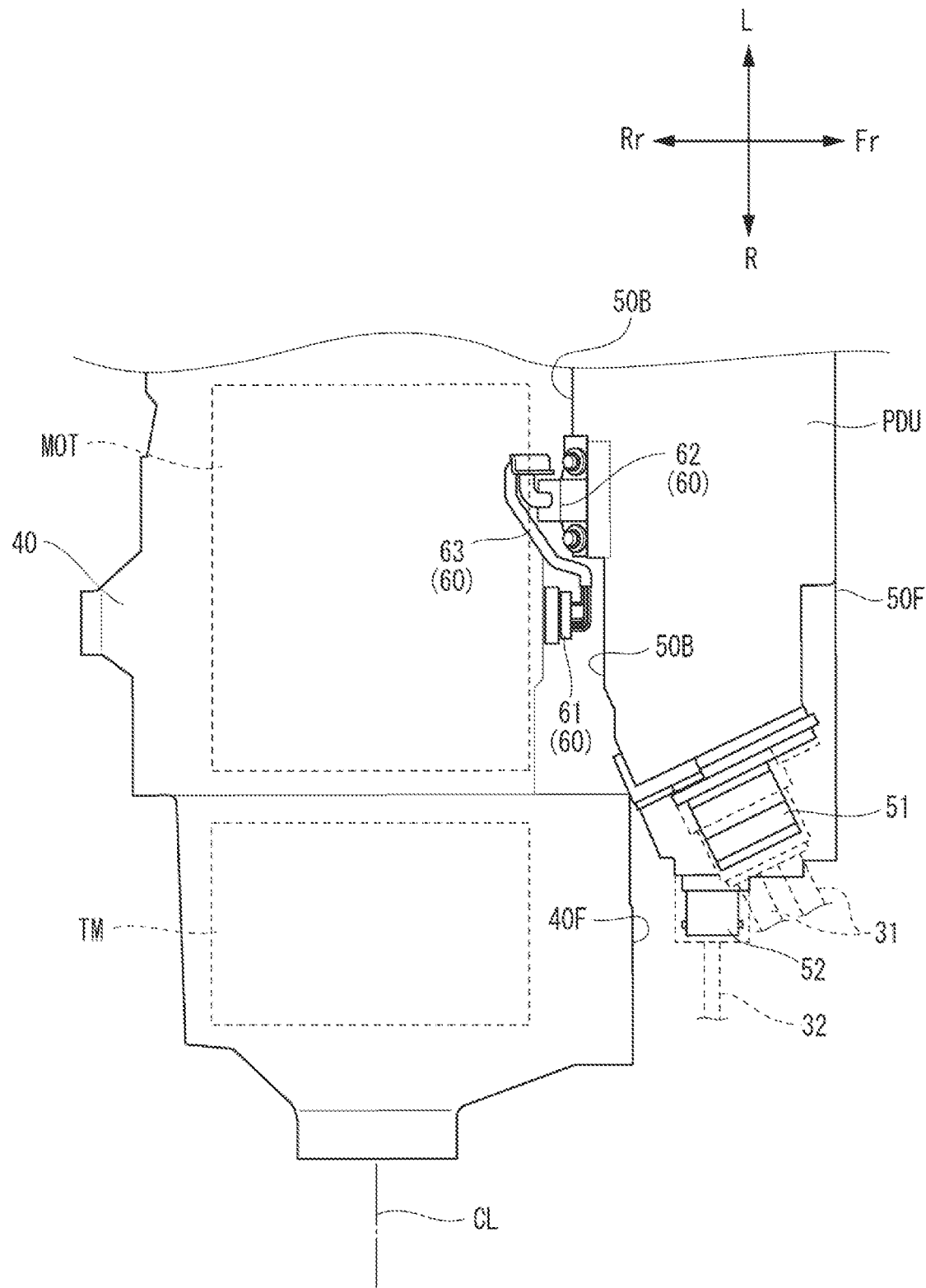
FIG. 7 is an enlarged view of a main part in which the driving unit of FIG. 3 is viewed from above.

As illustrated in FIG. 7, the DC connector 51 disposed on the upper right side surface 504 is disposed so as to protrude diagonally forward to the right from the electric power conversion device PDU when viewed from above. In other words, the DC connector 51 is disposed so as to be inclined at a predetermined angle in a direction away from the electric motor MOT in the front-rear direction and protrude from the electric power conversion device PDU toward the direction away from the electric power conversion device PDU in the left-right direction (rotation axis direction). As a result, a large space can be taken between the tip of the DC connector 51 and the electric motor case 40 in the front-rear direction when the DC line 31 is connected to the DC connector 51, and thus a work space is ensured with ease and maintainability is improved.

In addition, the DC connector 51 is disposed behind the front-side end portion of the electric power conversion device PDU in the front-rear direction, that is, on the electric motor MOT side. As a result, it is possible to prevent the DC connector 51 from being exposed outside the electric power conversion device PDU in the front-rear direction.

The low-voltage connector 52 disposed on the lower right side surface 503 is disposed so as to protrude to the right from the electric power conversion device PDU when viewed from above. In other words, the low-voltage connector 52 is disposed so as to protrude in the left-right direction (rotation axis direction) from the electric power conversion device PDU.

Accordingly, when viewed from above, the low-voltage connector 52 is disposed so as to protrude to the right from the electric power conversion device PDU whereas the DC connector 51 is disposed so as to protrude diagonally forward to the right from the electric power conversion device PDU, and thus the DC line 31 connected to the DC connector 51 and the low-voltage line 32 connected to the low-voltage connector 52 can be disposed so as to be misaligned in the front-rear direction and it is possible to prevent the positions of the DC line 31 and the low-voltage line 32 from interfering with each other.

Figure 8:
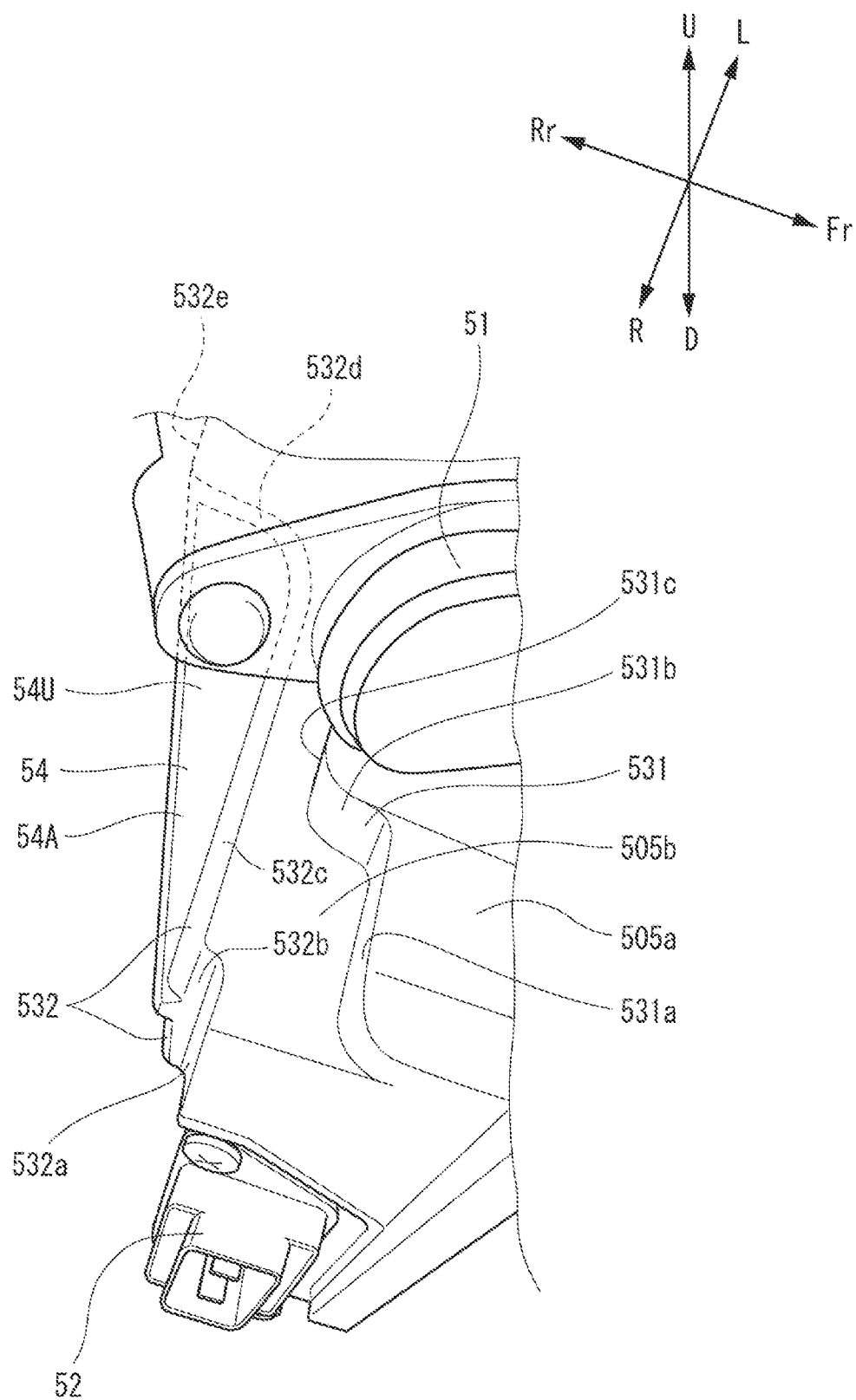
FIG. 8 is an enlarged perspective view of the periphery of the guide portion of the driving unit of an embodiment of the present invention.

As illustrated in FIG. 8, the step surface 505 of the electric power conversion device case 50 has a first step surface 505a extending substantially horizontally rearward from the front surface 50F of the electric power conversion device case 50 and a second step surface 505b extending substantially horizontally rearward on the rear side of the first step surface 505a and below the first step surface 505a. Further, the step surface 505 of the electric power conversion device case 50 has a first wall surface 531 extending in the up-down direction from the rear end of the first step surface 505a to the front end of the second step surface 505b. Further, the step surface 505 of the electric power conversion device case 50 is formed with a second wall surface 532 extending downward from the rear end of the second step surface and configuring a part of the rear surface 50B of the electric power conversion device case 50.

The first wall surface 531 has a right wall surface 531a extending leftward from the right end of the electric power conversion device case 50, a curved wall surface 531b extending rearward from the left end of the right wall surface 531a, and a left wall surface 531c extending leftward from the rear end of the curved wall surface 531b.

The second wall surface 532 has a right end wall surface 532a extending leftward from the right end of the electric power conversion device case 50, a first curved wall surface 532b extending rearward from the left end of the right end wall surface 532a, a right wall surface 532c extending leftward from the rear end of the first curved wall surface 532b, a second curved wall surface 532d extending rearward from the left end of the right wall surface 532c, and a left wall surface 532e extending leftward from the rear end of the second curved wall surface 532d.

As illustrated in FIGS. 5 and 8, a guide portion 54 is formed on the second wall surface 532 positioned above the electric motor connecting portion 70 and below the step surface 505 and configuring a part of the rear surface 50B. In the present embodiment, the guide portion 54 extends from the rear end of the second curved wall surface 532d of the second wall surface 532 toward the right end of the right wall surface 532c. Accordingly, the guide portion 54 protrudes rearward from the second wall surface 532 toward the electric motor case 40 and extends in the rotation axis direction. Further, the guide portion 54 has a shape having a tapered portion 54A extending from the rear end of the second curved wall surface 532d of the second wall surface 532 toward the right end of the right wall surface 532c and having a rearward protrusion length decreasing rightward. In other words, the rearward protrusion length of the tapered portion 54A of the guide portion 54 decreases as the distance from the electric motor connecting portion 70 to the tapered portion 54A of the guide portion 54 increases in the rotation axis direction.

Accordingly, in a case where foreign matter such as water enters between the electric power conversion device case 50 and the rotary electric machine case 40 from above the driving unit 30, the foreign matter which enters above the electric motor connecting portion 70 hits an upper surface 54U of the guide portion 54 and then is guided rightward along the upper surface 54U of the guide portion 54 and discharged to the right of the electric power conversion device case 50. As a result, it is possible to prevent the foreign matter which enters above the electric motor connecting portion 70 from entering the electric motor connecting portion 70.

In addition, the guide portion 54 is formed on the rear surface 50B of the electric power conversion device case 50, the guide portion 54 protrudes in the front-rear direction and extends in the rotation axis direction, and thus the moment of inertia of area and section modulus of the rear surface 50B of the electric power conversion device case 50 increase. As a result, the guide portion 54 also functions as a rib for rigidity and strength improvement and the rigidity and strength of the electric power conversion device case 50 are improved.

In addition, the guide portion 54 has the shape having the tapered portion 54A extending from the rear end of the second curved wall surface 532d of the second wall surface 532 toward the right end of the right wall surface 532c and having the rearward protrusion length decreasing rightward. Accordingly, it is possible to reduce the weight of the driving unit 30 while preventing foreign matter from entering the electric motor connecting portion 70 and the degree of freedom in designing the driving unit 30 can be increased. For example, a bolt or the like can be disposed behind the right end of the tapered portion 54A, that is, behind the right end of the right wall surface 532c of the second wall surface 532.

MODIFICATION EXAMPLE

Figure 9:
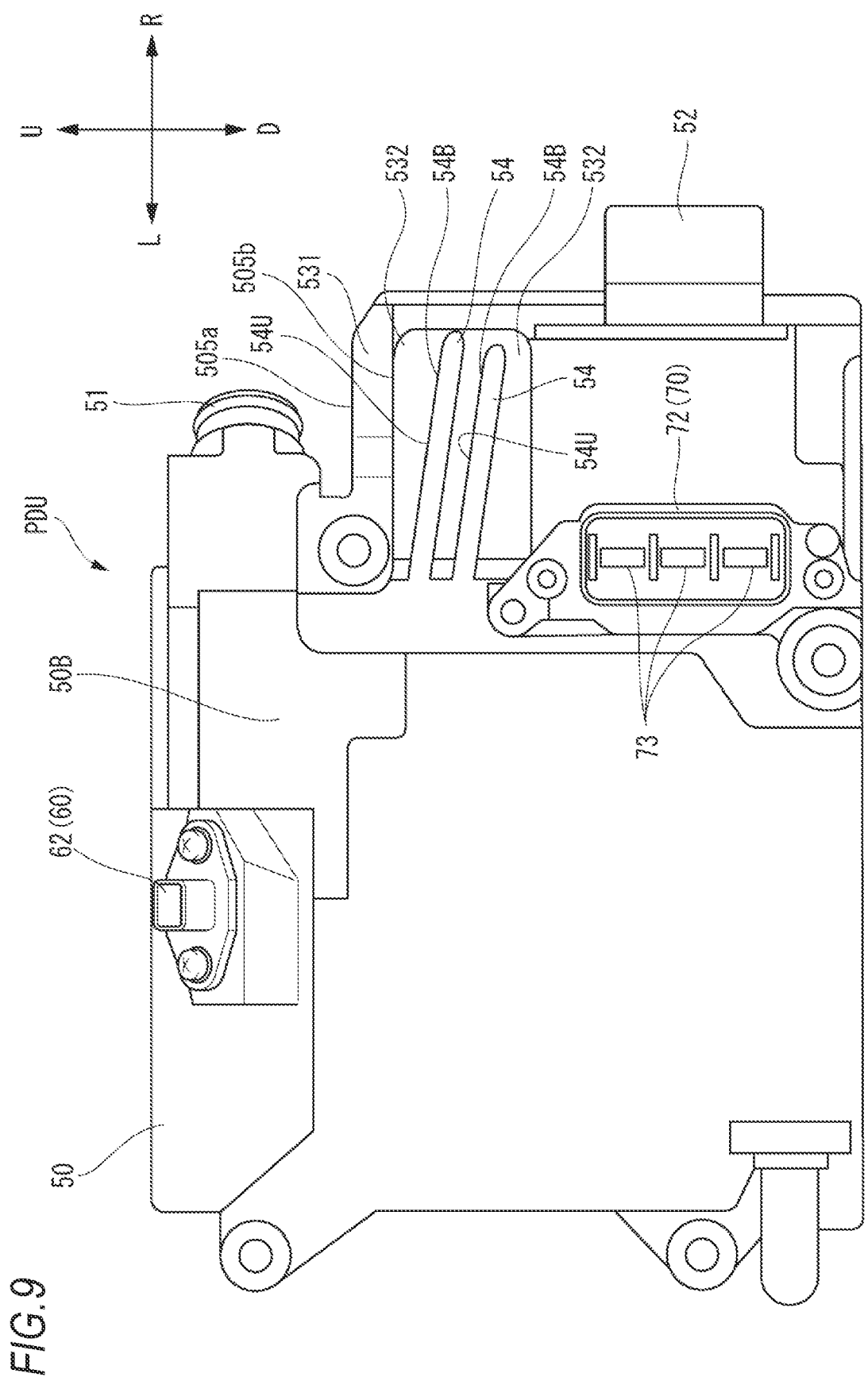
FIG. 9 is a rear view of the electric power conversion device of a modification example of the driving unit of an embodiment of the present invention.

As illustrated in FIG. 9, a plurality of the guide portions 54 may be formed on the second wall surface 532 side by side in the up-down direction. Further, the upper surface 54U of the guide portion 54 may have an inclined surface 54B inclined downward toward the right. In other words, the inclined surface 54B is inclined downward as the distance from the electric motor connecting portion 70 to the inclined surface 54B increases in the rotation axis direction.

By the guide portion 54 having the inclined surface 54B inclined downward as the distance from the electric motor connecting portion 70 to the inclined surface 54B increases in the rotation axis direction, foreign matter which enters above the electric motor connecting portion 70 can be more reliably guided to the right along the guide portion 54.

In addition, by the plurality of guide portions 54 being formed on the second wall surface 532 side by side in the up-down direction, foreign matter which enters above the electric motor connecting portion 70 can be more reliably guided to the right and the rigidity and strength of the electric power conversion device case 50 are further improved.

Although various embodiments have been described above with reference to the drawings, it is a matter of course that the present invention is not limited to such examples. It is clear that those skilled in the art can devise various changes or modifications within the scope of the claims, which naturally and understandably belong to the technical scope of the present invention. In addition, each component in the above-described embodiments may be freely combined within the scope of the invention.

For example, although a hybrid vehicle having the engine ENG and the electric motor MOT as its driving source is exemplified in the above embodiment, the vehicle may be an electric vehicle having only the electric motor MOT as its driving source.

In the above embodiment, the driving unit 30 accommodating the electric motor MOT is disposed in the rear portion of the vehicle 1. Alternatively, the electric motor MOT may be used as a driving source driving the left and right front wheels FW with the driving unit 30 disposed in the front room 6. In this case, it is preferable that the electric power conversion device PDU is disposed so as to be positioned between the electric motor MOT and the passenger compartment 4 in the front-rear direction, that is, such that the electric power conversion device PDU faces rearward.

In addition, although the guide portion 54 is formed at the electric power conversion device case 50 in the above embodiment, the guide portion 54 may be formed at the electric motor case 40 or both the electric power conversion device case 50 and the electric motor case 40.

At least the following matters are described in this specification. Although components or the like corresponding to the embodiment described above are in the parentheses, the present invention is not limited thereto.

(1) A driving unit (driving unit 30) including:
a rotary electric machine (electric motor MOT) which has a rotation axis (rotation axis CL) extending in a horizontal direction;
a rotary electric machine case (electric motor case 40) which has a rotary electric machine accommodating portion (electric motor accommodating portion 41) accommodating the rotary electric machine; and
an electric power conversion device (electric power conversion device PDU) which is electrically connected to the rotary electric machine and converts electric power supplied to the rotary electric machine and electric power supplied from the rotary electric machine, in which:
the electric power conversion device has an electric power conversion device case (electric power conversion device case 50) and is disposed on one side of the rotary electric machine in an orthogonal direction (front-rear direction) orthogonal to both a rotation axis direction and an up-down direction;
the electric power conversion device case is fixed to the rotary electric machine case;
a connecting portion (electric motor connecting portion 70) where the rotary electric machine and the electric power conversion device are electrically connected is provided; and
a guide portion (guide portion 54) protruding in the orthogonal direction and extending in the rotation axis direction is formed above the connecting portion at either the electric power conversion device case or the rotary electric machine case.

According to (1), the guide portion protruding in the orthogonal direction and extending in the rotation axis direction is formed above the connecting portion at either the electric power conversion device case or the rotary electric machine case. As a result, even in a case where foreign matter such as water enters between the electric power conversion device case and the rotary electric machine case from above the driving unit, the foreign matter which enters from above the connecting portion is guided in the rotation axis direction along the guide portion. As a result, it is possible to prevent the foreign matter which enters from above the connecting portion from entering the connecting portion.

(2) The driving unit according to (1), in which
the guide portion is formed at the electric power conversion device case.

According to (2), the guide portion is formed at the electric power conversion device case. As a result, the rigidity and strength of the electric power conversion device case are improved by the guide portion protruding in the orthogonal direction and extending in the rotation axis direction.

(3) The driving unit according to (1) or (2), in which
the guide portion has a tapered portion (tapered portion 54A) where a protrusion length in the orthogonal direction decreases as a distance from the connecting portion increases in the rotation axis direction.

According to (3), the guide portion has the tapered portion where the protrusion length in the orthogonal direction decreases as the distance from the connecting portion increases in the rotation axis direction. As a result, it is possible to reduce the weight of the driving unit while preventing foreign matter from entering the connecting portion and the degree of freedom in designing the driving unit can be increased.

(4) The driving unit according to any one of (1) to (3), in which
an upper surface (upper surface 54U) of the guide portion has an inclined surface (inclined surface 54B) inclined downward as a distance from the connecting portion increases in the rotation axis direction.

According to (4), the guide portion has the inclined surface inclined downward as the distance from the connecting portion increases in the rotation axis direction. As a result, foreign matter which enters above the connecting portion can be more reliably guided in the rotation axis direction along the guide portion.

(5) The driving unit according to any one of (1) to (4), in which
a plurality of the guide portions are formed side by side in the up-down direction.

According to (5), the plurality of guide portions are formed side by side in the up-down direction. As a result, foreign matter which enters above the connecting portion can be more reliably guided in the rotation axis direction and the rigidity and strength of the electric power conversion device case are further improved.

REFERENCE SIGNS LIST 30 driving unit
40 electric motor case (rotary electric machine case)
41 electric motor accommodating portion (rotary electric machine accommodating portion)
50 electric power conversion device case
54 guide portion
54U upper surface
54A tapered portion
54B inclined surface
70 electric motor connecting portion (connecting portion)
MOT electric motor (rotary electric machine)
PDU electric power conversion device
CL rotation axis

The invention claimed is:

1. A driving unit to be equipped with a vehicle, the driving unit comprising:
a rotary electric machine which has a rotation axis extending in a horizontal left-right direction of the vehicle;
a rotary electric machine unit which includes a rotary electric machine case having a rotary electric machine accommodating portion accommodating the rotary electric machine; and
an electric power conversion device which is electrically connected to the rotary electric machine and converts electric power supplied to the rotary electric machine and electric power supplied from the rotary electric machine, wherein:
the electric power conversion device has an electric power conversion device case and is disposed on one side of the rotary electric machine case in a front-rear direction orthogonal to both a rotation axis direction and an up-down direction of the vehicle;
the electric power conversion device case is fixed to the rotary electric machine case;
a connecting portion where the rotary electric machine and the electric power conversion device are electrically connected is provided; and
a guide portion protruding rearward in the front-rear direction and extending in the rotation axis direction is formed above the connecting portion at either the electric power conversion device case or the rotary electric machine case,
wherein the connecting portion is disposed below the rotation axis and between the rotary electric machine and the electric power conversion device in the front-rear direction.

2. The driving unit according to claim 1, wherein
the guide portion is formed at the electric power conversion device case.

3. The driving unit according to claim 1, wherein
the guide portion has a tapered portion where a protrusion length in the front-rear direction decreases as a distance from the connecting portion increases in the rotation axis direction.

4. The driving unit according to claim 1, wherein
an upper surface of the guide portion has an inclined surface inclined downward as a distance from the connecting portion increases in the rotation axis direction.

5. The driving unit according to claim 1, wherein
a plurality of the guide portions are formed side by side in the up-down direction.

* * * * *